United States Patent [19] [11] 4,378,004

Petrie [45] Mar. 29, 1983

[54] ENGINE CONTROL SYSTEM WITH CYLINDER IDENTIFICATION APPARATUS

[75] Inventor: Adelore F. Petrie, Arlington Heights, Ill.

[73] Assignee: Motorola Inc., Schaumburg, Ill.

[21] Appl. No.: 237,347

[22] Filed: Feb. 23, 1981

[51] Int. Cl.³ .......................... G01B 7/00; H03K 3/00; F02P 5/04; F02D 5/02

[52] U.S. Cl. .................................... 123/643; 123/414; 123/416; 123/476

[58] Field of Search ............... 123/643, 631, 414, 416, 123/418, 490, 476

[56] References Cited

U.S. PATENT DOCUMENTS

| | | | |
|---|---|---|---|
| 3,941,103 | 3/1976 | Hartig | 123/416 |
| 4,181,884 | 6/1980 | Shirosaki et al. | 123/414 |
| 4,207,846 | 6/1980 | Borst et al. | 123/643 |
| 4,250,846 | 2/1981 | Menard | 123/414 |
| 4,262,251 | 4/1981 | Fujishiro et al. | 123/643 |
| 4,284,052 | 8/1981 | Hanisko | 123/476 |
| 4,313,414 | 2/1982 | Planteline | 123/643 |

*Primary Examiner*—Raymond A. Nelli
*Attorney, Agent, or Firm*—Phillip H. Melamed; James S. Pristelski; James W. Gillman

[57] ABSTRACT

A four-cylinder engine control system (10) for controlling the functions of ignition or fuel injection is disclosed. The control system includes cylinder identification apparatus (30, 50, 60) which operates in conjunction with a rotary member (11) rotated by the engine crankshaft having timing projections (14, 17) corresponding to specific rotational positions of the crankshaft. A pair of fixed sensors (20, 21) sense the passage of the timing projections and provide corresponding signals to an engine timing calculation and control circuit (40) which provides control signals that are sequentially selectively routed to control ignition and/or fuel injection of the engine cylinders in a predetermined sequence. One timing projection (14) comprises two individual radial extensions (15, 16) whereas another comprises a single extension (17). Cylinder identification apparatus utilizes sensor pulses (200, 201) provided by the fixed sensors to distinguish between the passage of the pair of extensions versus the passage of the single extension and provide a cylinder identification pulse (207) indicative of the rotational position of the engine crankshaft. This is accomplished by a first pulse reject circuit (60) which provides an output when one of the sensors produces two pulses prior to the other sensor producing a subsequent pulse. This output is then utilized to initialize the sequential gating of control signals to cylinder control apparatus.

15 Claims, 5 Drawing Figures

AS/B
RS
C
D
E
F
G
H
POR
I
J
K
L
M
N
200
201
202
203
204
205
206
207
208
209
210
211
212
213
214
215
216
DELAY

ENGINE CONTROL SYSTEM WITH CYLINDER IDENTIFICATION APPARATUS

BACKGROUND OF THE INVENTION

The present invention generally relates to the field of engine control systems which provide control signals for controlling engine cylinder apparatus associated with each cylinder of a three or more cylinder engine. More particularly, the present invention relates to an engine control system which includes an improved cylinder identification apparatus to insure the proper sequential routing of engine control signals to control apparatus associated with each cylinder of a three or more cylinder engine.

Analog and digital engine control systems which develop electronic control signals for controlling engine functions are known and an example of such an analog system is illustrated in U.S. Pat. No. 4,104,997 to Kenneth Padgitt, entitled "Multiple Slope Ignition Spark Timing Circuit", whereas an example of a digital engine control system is illustrated in U.S. Pat. No. 4,231,332 to Robert Wrathall, entitled "Spark and Dwell Ignition Control System Using Digital Circuitry", both of the preceding U.S. patents being assigned to the same assignee as the present invention. In both of the aforementioned U.S. patents, engine position sensors are utilized to provide sensor pulses indicative of engine crankshaft position and speed and control circuits are disclosed which process these sensor pulses to provide control signals to control the dwell and spark occurrence functions for each of the engine cylinders. In the Wrathall '332 patent, a two-cylinder engine control system is disclosed wherein a combination dwell and spark occurrence control signal is utilized to simultaneously provide control excitation for a single pair of engine cylinders. The aforementioned Padgitt '997 patent illustrates an analog system wherein an additional sensor is utilized solely for the purpose of determining the sequence in which two pairs of engine cylinders (in a four-cylinder engine) should receive a composite dwell and spark timing signal.

Generally, when the engine functions of more than two cylinders of an engine must be controlled, it is necessary to distinguish between a plurality of various sensor pulses produced by each sensor during each revolution of the engine crankshaft such that the functions of the engine cylinders will be controlled in the proper sequence with each cylinder receiving a control signal while the cylinder piston is at a proper compression and/or exhaust cycle position with respect to the engine crankshaft rotational position. In the Padgitt '997 patent this is accomplished through the use of an additional sensor whose sole function is to distinguish between different half cycles of revolution of the engine crankshaft. Since sensors are costly as compared with other electronic circuitry, while the Padgitt patent provides a feasible solution to identifying whether ignition control sensor pulses are associated with one or another half cycles of the engine crankshaft rotary position, this solution is not cost effective.

Other types of engine cylinder identification apparatus have also utilized additional sensors for the sole purpose of distinguishing between various portions of the revolution cycle of the engine crankshaft, and therefore these systems suffer from the same cost problems as the Padgitt '997 patent.

Typically, the prior systems which utilize sensors to provide cylinder identification information have been unable to block sensor outputs during spark occurrence. The result is that erroneous cylinder identification is possible since during spark creation the sensor may produce false output pulses.

While the Wrathall '332 U.S. patent provides a cost effective spark and dwell control system for a two-cylinder engine, expanding this system to a four-cylinder engine according to the teachings of the prior art would generally involve the use of an additional sensor to provide additional information to the control system so as to properly route the engine control signals to the proper engine cylinders in the proper sequence.

While the discussed systems relate to the production of engine dwell and spark timing control signals, the same problem exists for engine fuel injection systems wherein the routing of an electronically generated fuel injection control signal to the proper engine cylinder fuel injectors may require an additional sensor merely to provide additional engine crankshaft rotational position information to the control system so as to insure the proper sequencing of control information to the proper cylinders. Copending U.S. patent applications Ser. Nos. 183,657, to Hunninghaus et al, and 183,658, to Bolinger, both filed on Sept. 2, 1980 and both assigned to the same assignee as the present invention deal with cylinder identification systems which insure the synchronizing of fuel injection signals for four or more cylinder engine. Both of these applications illustrate how additional sensors can be utilized to provide cylinder identification information.

Some engine control systems attempt to utilize the same sensor or sensors for providing a plurality of engine position pulses for each crankshaft revolution while distinguishing between these plurality of pulses through the use of additional circuitry. These systems generally distinguish between a reference pulse duration and sensor pulses having different time durations by circuitry which makes this determination as a function of engine crankshaft speed wherein the accuracy of properly identifying which of the plurality of sensor pulses should be associated with which engine cylinder becomes a function of engine crankshaft speed. Typically, these systems distinguish between the reference pulse duration and other sensor pulse durations by use of elapsed time counting circuits, and these systems do not function at all at very low engine speeds encountered during engine start up (unless extremely large capacity counters are used), since these systems must operate properly at normal engine speeds. In addition, these systems generally utilize only a single sensor and would not be readily adaptable to the dual sensor engine control system illustrated in the Wrathall '332 patent wherein one sensor is positioned at a stationary position defining the latest dwell initiation position of the engine crankshaft for the engine cylinders whereas another stationary sensor is positioned to define the latest time occurrence of spark ignition for engine cylinders. Some systems which utilize a pair of sensors determine cylinder identification by the time coincidence of sensor pulses, but these systems are subject to false identifications due to spark causing simultaneous pulses in each sensor.

SUMMARY OF THE PRESENT INVENTION

An object of the present invention is to provide an improved engine control system with engine cylinder identification apparatus which overcomes the above described deficiencies of prior systems.

A more particular object of the present invention is to provide an improved engine control system which is adaptable for controlling either spark and dwell engine functions and/or fuel injection engine functions while providing engine speed independent cylinder identification which is utilized to insure the proper sequencing of control signals to the various engine cylinders.

A more detailed object of the present invention is to provide an engine spark timing control system with an improved cylinder identification apparatus that readily enables the expansion of the ignition control system described in U.S. Pat. No. 4,231,332 to Wrathall to enable the control system to control engines having three or more cylinders.

In one embodiment of the present invention, an engine control system adaptable for controlling engine functions for a three or more cylinder engine is provided. The control system of the present invention comprises: a rotary member synchronously rotated by an engine crankshaft, said rotary member having at least first and second devices fixed thereto and spaced apart by a first fixed angle of rotation of said rotary member; first and second stationary sensor means positioned adjacent to said rotary member for detecting the passage of said first and second devices and producing pulses in response thereto, said first and second sensors positioned apart by a second fixed angle of rotation of said rotary member; and control circuit means for receiving said sensor pulses produced by said first and second sensor means and providing in response thereto control signals for controlling engine functions as a function of at least one of the rotational position of the rotary member and engine crankshaft speed, the improvement comprising an engine cylinder identification means for identifying when a predetermined rotational position of said rotary member occurs, said cylinder identification means characterized by, said first device comprising a plurality of at least two adjacent individual devices spaced apart by a fixed angle of rotation less than said second angle of rotation, passage of each of said individual devices by either of said sensor means providing a corresponding sensor pulse, said second fixed angle of rotation being less than said first fixed angle of rotation, and a first pulse reject circuit means for receiving pulses corresponding to said sensor pulses and for providing an initial cylinder identification pulse in response to determining if said first sensor means provides more than one pulse prior to a time no more than approximately the time at which said second sensor means subsequently provides a pulse after said first sensor means provides a first pulse, whereby said cylinder identification means can readily distinguish between the passage of said first and second devices by the first and second sensor means and thereby correctly identify the precise rotational position of said rotary memeber and engine crankshaft.

Preferably, the first and second devices comprise outwardly extending projections of said rotary body. Also, preferably, said control circuit means provides engine cylinder dwell and spark ignition control signals which are received by cylinder ignition means which properly routes these control signals to the appropriate engine cylinders. In addition, the preferred embodiment of the present invention contemplates a four-cylinder engine and locating the first and second stationary sensors at positions corresponding to the latest times of dwell initiation and spark timing occurrence for the engine cylinders.

Essentially, the present invention functions by distinguishing between the first device, which comprises a pair of extending projections, and the second device which comprises a single extending projection. Both first and second devices are required since two sets of engine timing pulses are required for each engine crankshaft revolution. Proper engine sequencing is required since the engine control signals produced in response to the passage of each of the first and second devices by the sensors must be routed to the proper engine cylinders to insure that the control signals are received by proper engine cylinders in their proper engine cycle position. The present invention accomplishes this without the use of an additional sensor and without relying upon circuitry in which the distinguishing between the first and second devices is dependent upon engine crankshaft speed. This is because the present invention relies upon the first sensor producing two pulses prior to the second sensor producing a pulse in response to the passage of the first device, comprising two projections, by the first and second sensors whereas only a single pulse will be generated by each sensor in response to the second device passing the first and second sensors. The cylinder identification apparatus of the present invention is speed independent, thus the present invention is capable of operating at very low speeds. Also, the apparatus of the present invention can be used with circuitry to block the output of one of the two sensors during spark creation to avoid false sensor output pulses.

The present invention readily contemplates expanding the present system by adding additional devices to the rotary member while maintaining the concept of distinguishing between the passage of these devices by the sensors by determining how many pulses are provided by the first sensor prior to the provision of a pulse by the second sensor. Thus, the present invention is readily expandable to six and eight cylinder engines and can be adapted to engine fuel injection control apparatus as well as engine spark timing control apparatus.

BRIEF DESCRIPTION OF THE DRAWINGS

For a more complete understanding of the present invention, reference should be made to the drawings, in which.

DESCRIPTION OF THE PREFERED EMBODIMENTS

Figure 1:
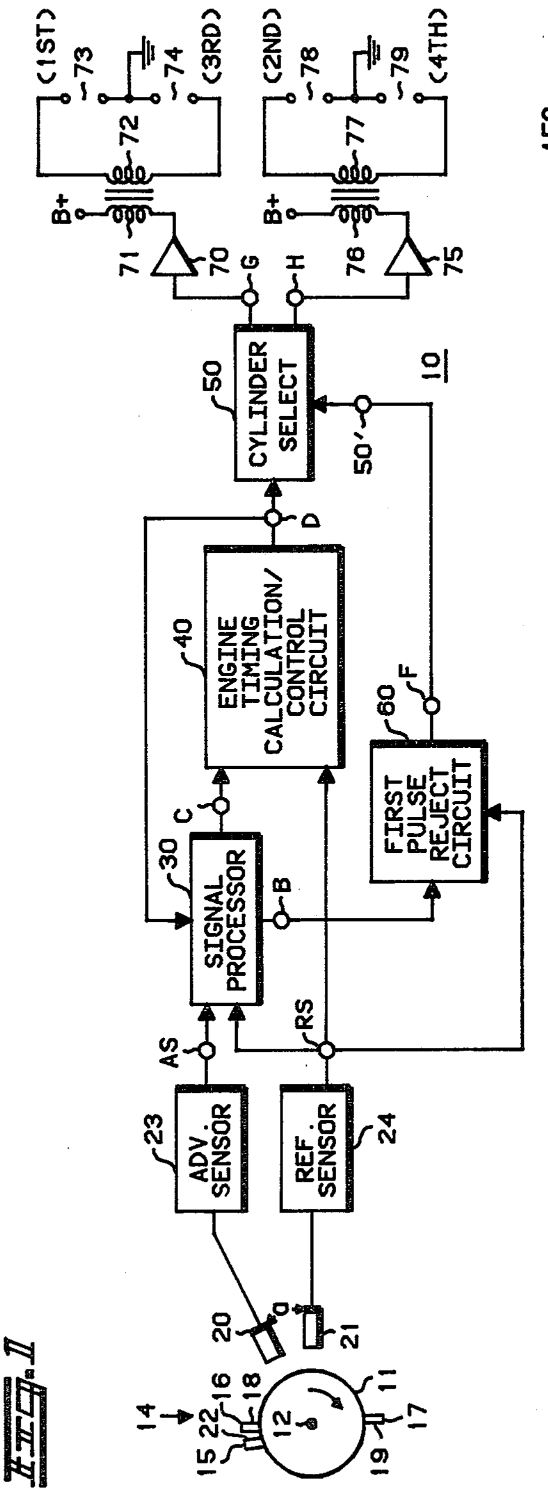
FIG. 1 is a block and schematic diagram of a four-cylinder engine control system with cylinder identification apparatus.

FIG. 1 illustrates a four-cylinder engine control system 10 which includes cylinder identification apparatus for distinguishing between various different engine crankshaft rotational positions each of which result in the generation of sensor pulses and control signals. The cylinder identification apparatus routes the developed control signals to appropriate engine cylinder apparatus in a desired predetermined sequence. The system 10 includes a rotary member 11 which is synchronously rotated by the engine crankshaft about an axis 12 wherein this rotation is shown in a clockwise direction in FIG. 1. The rotary member 11 has a first device 14 affixed thereto comprising two adjacent individual radially outwardly extending projections 15 and 16. A second device 17 is also affixed to the rotary member 11 and comprises a single radial outward extending projection. A leading edge 18 of the projection 16 is positioned approximately 180 degrees apart from a leading edge 19 of the device 17 wherein this 180 degrees corresponds to a first fixed predetermined amount of angular rotation of the rotary member 11. The projections 15 and 16 are spaced substantially closer than this first predetermined angle of rotation with the projection 16 having a leading edge time occurrence $t_1$ prior to the time occurrence $t_2$ of a leading edge 22 of the projection 15 with respect to any stationary sensor positioned about the rotary member 11.

In the engine control system 10, a first stationary sensor element 20 is positioned at a location adjacent to the rotary member 11 such that when the leading edges 18 and 19 pass the sensor element 20, these time occurrences correspond, respectively, to engine crankshaft rotational positions corresponding to the latest times of dwell initiation for each of the four engine cylinders. A second stationary sensor element 21 is also positioned adjacent to the rotary member 11 at a predetermined location such that when the leading edges 18 and 19 pass the sensor element 21, this corresponds to engine crankshaft rotational positions corresponding to the latest times of spark occurrence for the four engine cylinders. The first and second sensing elements 20 and 21 are positioned apart by a second predetermined fixed angle of rotation of the rotary member 11 wherein this second angle is designated by the reference character $\alpha$. This second fixed angle of rotation is less than the first fixed angle of rotation (180 degrees) between the leading edges 18 and 19. It should also be noted that the projection 15 leading edge 22 is spaced apart from the leading edge 18 by a fixed angle of rotation which is less than the second fixed angle of rotation $\alpha$ that corresponds to the spacing between the sensor elements 20 and 21.

The sensor element 20 is coupled to an advance sensor module 23 whereas the sensor element 21 is coupled to a reference sensor module 24. The sensor modules 23 and 24 merely comprise signal conditioning circuitry such as amplifiers and pulse shapers so as to enhance pulse transition outputs provided by the sensor elements 20 and 21. The sensor modules 23 and 24 provide conditioned sensor pulses to output terminals AS and RS, respectively. Thh sensor pulses provided at the terminals AS and RS are utilized by the remaining circuitry of the engine control system 10 to generate engine timing control signals and to properly route these control signals to apparatus associated with the engine cylinders for utilization thereby.

The sensor elements 20 and 21 can comprise either standard reluctance, Hall effect or R.F. proximity sensors, and the rotary member devices 14 and 15 can comprise either magnets or metallic extensions of the member 11.

Figure 2:
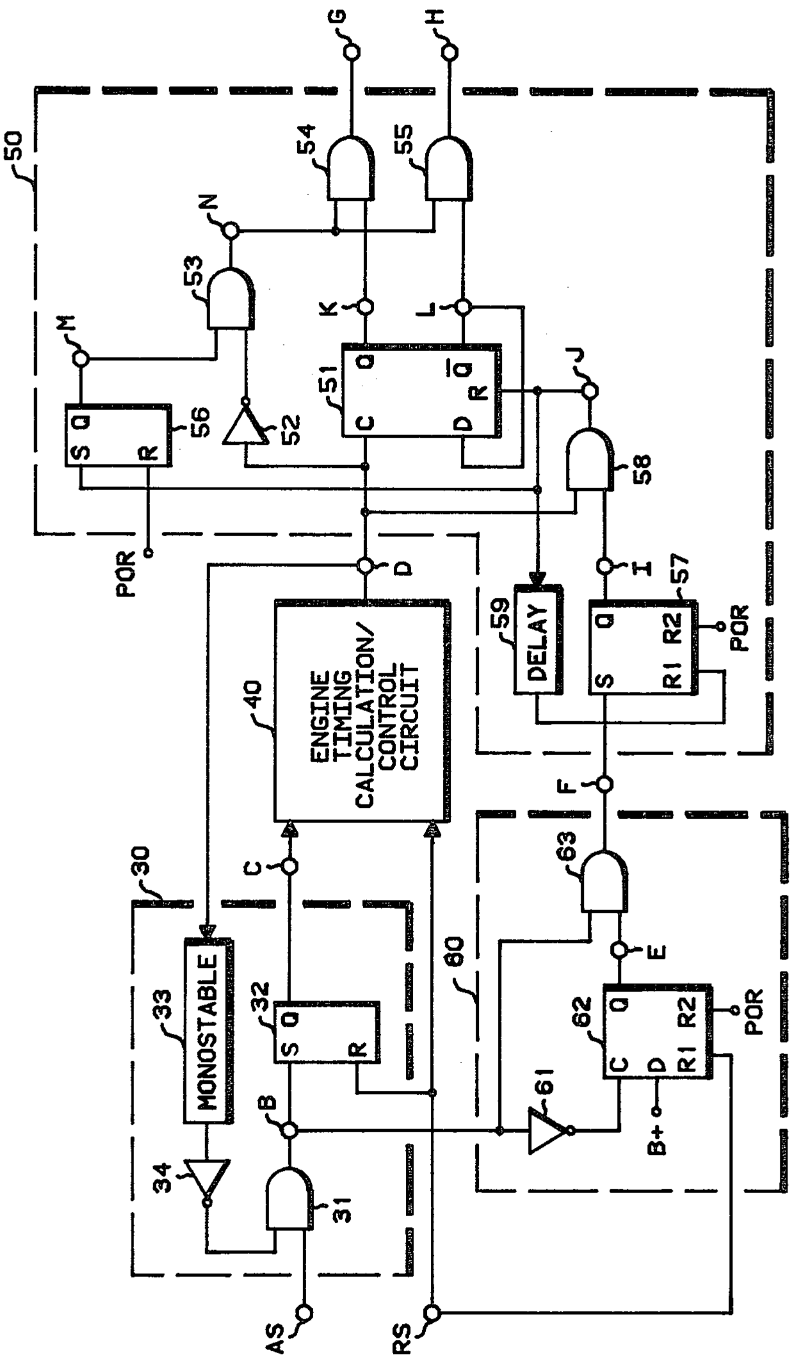
FIG. 2 is a combination detailed block and schematic diagram of various portions of the control system shown in FIG. 1.
Figure 3:
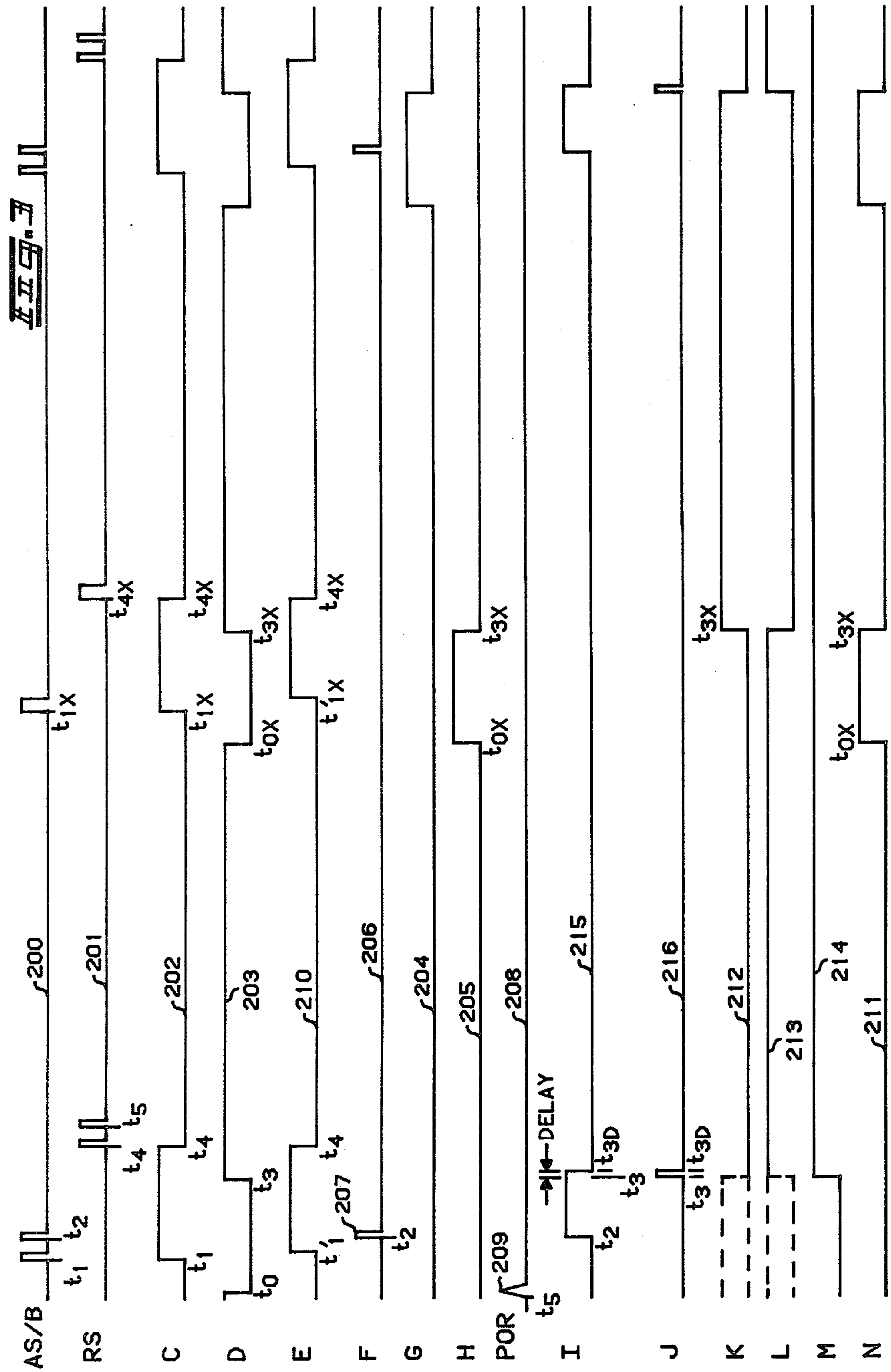
FIG. 3 is a series of graphs illustrating the waveforms of signals provided by the apparatus shown in FIGS. 1 and 2.

FIG. 3 illustrates a series of graphs for signal waveforms for various electrical signals provided by the engine control system 10. In each graph, the horizontal axis is time and the vertical axis is magnitude, and each graph is drawn to the same horizontal time scale. The first two graphs in FIG. 3 illustrate the waveform of signals 200 and 201 provided at the sensor output terminals AS and RS, respectively. In FIG. 3, reference letters designating various signal terminals in FIGS. 1 and 2 are used to identify the signal waveforms associated with those terminals.

The signal 200 at the terminal AS, for the rotary member 11 shown in the position illustrated in FIG. 1 and commencing rotation in a clockwise direction, comprises first and second rapidly occurring pulses having time occurrences $t_1$ and $t_2$ corresponding to the passage of the leading edges 19 and 22 past the sensor element 20. This is followed, after substantially 180 degrees of rotation of the rotary member 11, by the passage of the leading edge 19 by the sensor element 20 resulting in the production of another pulse commencing at a time $t_{1x}$. The signal 200 will then recommence identical portions after another approximately 180 degrees of angular rotation.

The signal 201 provided at the terminal RS is substantially similar to signal 200 except that the actual time occurrences for the corresponding pulses produced in response to the passage of the leading edges by the sensor element 21 are delayed by a time equivalent to a fixed amount of angular revolution of the rotary member 11, wherein it should be noted that this fixed angular revolution will correspond to various actual time durations depending upon the speed of angular revolution of the engine crankshaft. The signal 201 has two closely spaced pulses provided in response to the passage of the leading edges 18 and 22 at the times $t_4$ and $t_5$, and in response to the passage of the leading edge 19 by the sensor element 21, a pulse commencing at a time $t_{4x}$ is provided. It should be noted that the terminology decribing the commencing of the pulses shown in the waveforms designating the signals 200 and 201 at the terminals AS and RS refers to the production of rising edges of the pulses which correspond to the passage of the leading edges of the projections 15–17.

Essentially, the engine control system 10 receives the sensor pulses at the terminals AS and RS and develops engine control signals for controlling, preferably, the engine function of spark ignition. The sensor pulses are also utilized to insure the proper routing of these engine control signals to the engine cylinders in a desired predetermined sequence with each engine cylinder receiving the proper control signal at the time that the engine cylinder is in its proper engine cycle position of compression and/or exhaust. The crux of the present invention concerns the utilization of the sensor pulses provided at the terminals AS and RS to insure the proper sequential routing of the control signals produced by the engine control system 10 and this will now be discussed in detail.

The terminals AS and RS at which the sensor pulses are produced are both coupled to a signal processor circuit 30 which is shown in block diagram form in FIG. 1 and is shown in detail in FIG. 2. The signal processor 30 comprises an AND gate 31 that receives the signal 200 at the terminal AS as one input and provides an output signal at a terminal B which is coupled as an input to the set terminal of a set-reset flip-flop 32. The output terminal of the flip-flop 32 is coupled to an output terminal C and the reset terminal of the flip-flop 32 receives an input via a direct connection to the terminal RS. The signal processor 30 includes a monostable oneshot multivibrator circuit 33 which receives an input trigger signal from a terminal D and has its output coupled via an inverter stage 34 as an additional input to the AND gate 31.

The elements 31–34 comprise the signal processor 30 which essentially provides for creating a signal 202 at the terminal C by providing a latched output in response to the passage of a leading edge by the sensor element 20 and resetting this latched signal 202 in response to the passage of the same leading edge by the sensor element 21. Thus, the signal 202 at the terminal C corresponds to that shown in FIG. 3 which becomes latched at the times $t_1$ and $t_{1x}$ and unlatched at the times $t_4$ and $t_{4x}$.

The monostable one-shot 33 provides a short duration pulse in response to positive going transitions of the signal at the terminal D. The outut of the short duration monostable 33, since it is coupled via an inverter stage 34 to the AND gate 31, effectively results in blocking the passage of the signal 200 at the terminal AS through the AND gate 31 for a short duration subsequent to the creation of an abruptly rising signal transition at the terminal D. This is done because the abruptly rising signal at the terminal D, in the preferred embodiment, takes place at a time $t_3$ at which cylinder spark ignition should occur. Thus, the monostable 33 and inverter 34 prevent erroneous sensor pulses from being passed through the AND gate 31 due to the sensor element 20 picking up noise from the creation of spark ignition rather than providing pulses due to the passage of the projections 15–17.

The signal 200 is shown in FIG. 3 as the sensor pulses provided at the terminal AS without the generation of noise pulses created at the spark times $t_3$, and it should be noted that the waveform of the signal actually produced at the terminal B therefore directly corresponds to the signal 200 illustrated in FIG. 3.

The latched sensor pulse signal 202 provided at the terminal C is provided as one input to an engine timing calculation/control circuit 40 which also has a direct input connection to the reference sensor terminal RS and provides an output signal 203 at the terminal D. It is contemplated that the control circuit 40 is preferably an engine spark timing calculation and control circuit substantially similar to the embodiment shown in U.S. Pat. No. 4,231,332 to Robert Wrathall, assigned to the same assignee as the present invention. The circuit in the '332 patent receives sensor pulses provided by a pair of sensing elements and provides a combined dwell initiation and spark occurrence timing signal at an output terminal which is utilized to control the dwell and spark timing of a two-cylinder engine. The output control signal provided by the '322 patent is substantially identical to the signal 203 provided at the terminal D. For the general case in which the engine is operating at a medium speed, the signal 203 at the terminal D will comprise a falling edge transition at time $t_0$ to the time $t_1$, wherein the time $t_0$ corresponds to the time of dwell initiation, and a rising edge transition at time $t_3$ prior to the time $t_4$ wherein this rising edge transition corresponds to the time of spark occurrence. Similar reltionships exist for subsequent times $t_{0x}$ and $t_{3x}$ which occur prior, respectively, to the times $t_{1x}$ and $t_{4x}$.

It should be noted that for the ignition system contemplated by the present invention, which corresponds to that contemplated by the Wrathall '332 patent, for low engine speed conditions such as encountered during engine starting, the times $t_0$ and $t_3$ will correspond precisely, to the times $t_1$ and $t_4$ since the passage of each of the leading edges 18 or 19 by the sensor elements 20 and 21 will result in dwell initiation and spark occurrence with the dwell duration corresponding to a fixed amount of angular rotation of the crankshaft corresponding to the spacing between the sensor elements 20 and 21.

While preferably the engine timing calculation/control circuit 40 is contemplated as comprising a spark and dwell ignition control circuit such as that shown in the Wrathall '332 patent, the broader concepts of the present invention also apply to known engine control circuits which provide fuel injection drive signals as their output wherein these signals would also receive sensor pulses and have similar calculation circuitry therein to determine the appropriate times for initiating and terminating fuel injection into each engine cylinder as a function of at least one of the parameters of engine crankshaft position and engine speed.

The signal 203 at the terminal D comprises a dwell initiation and spark timing occurrence signal which is readily utilizable as the primary coil drive and termination signal for a two-cylinder engine, and the Wrathall '332 patent utilizes this signal in this context, and merely eliminates one of the two devices 14 or 17 on the rotary member 11. However, because the present system is preferably concerned with a four-cylinder engine, for each crankshaft revolution of 360 degrees, a pair of dwell initiation and spark termination signals must be provided and these signals must then subsequently be routed to the proper associated engine cylinders. The present invention accomplishes this through the use of a cylinder select circuit 50 which receives the signal 203 at the terminal D via a direct input connection and provides complimentary output signals 204 and 205 at terminals G and H, respectively. In addition, the engine control system 10 of the present invention also utilizes a first pulse reject circuit 60 which receives input signals 200 and 201 via direct connections to the terminals B and RS and provides at an output terminal F a signal 206 an initial cylinder identification pulse 207 which indicates which of the devices 14 or 17 have passed by the sensor elements 20 and 21 resulting in the production of sensor pulses. The cylinder identification information signal 206 produced at the terminal F is provided as an input to a synchronizing terminal 50' of the cylinder select circuit 50 to insure the initialization and proper synchronized routing of the control signal 203 at the terminal D to the various engine cylinders. The manner in which this is accomplished will now be discussed in detail.

Essentially, the first pulse reject circuit 60 determines which of the devices 14 or 17 have passed by the sensor elements 20 and 21 and produced corresponding pulses. The circuit 60 accomplishes this by providing the initial cylinder identification pulse 207 at the terminal F in response to the circuit 60 determining if the first sensor element 20 has provided more than one pulse at the sensor terminal AS prior to a time no later than approximately the time at which the second sensor element 21 subsequently provides a pulse at the terminal RS after the first sensor element 20 had provided a pulse.

The detailed structure of the first pulse reject circuit 60 is illustrated in FIG. 2. The terminal B is connected through an inverter stage 61 to the clock terminal of a flip-flop circuit 62 which has its data terminal directly connected to a constant high potential terminal B+. The flip-flop 62 has two reset inputs, a first ($R_1$) of these inputs being directly connected to the terminal RS and a second ($R_2$) being connected to a power-on-reset (POR) terminal. An output terminal Q of the flip-flop 62 is connected to a terminal E which provides, via a direct connection, an input signal 210 to an AND gate 63 that receives another input via a direct connection to the terminal B. The AND gate 63 provides an output to the terminal F.

As noted above, the signal at the terminal B has the same waveform as the signal 200 at the terminal AS shown in FIG. 3, and therefore will be referred to as signal 200. The signal at the terminal POR is also illustrated in FIG. 3 as a signal 208 and merely comprises an initializing pulse 209 at a time $t_s$ which occurs at the initial application of power to the entire engine control system 10. The signal 208 at the terminal POR results in initializing the flip-flop 62 such that the signal 210 at the terminal E remains low until the first occurrence of a rising edge at the clock terminal of the flip-flop 62. This occurs at the falling edge of the sensor pulse at the terminal AS which commenced at the time $t_1$. Thus essentially, the inverter 61 merely provides for clocking the flip-flop 62 at a small but finite time later than the time $t_1$ wherein this small later time is designated in FIG. 3 as the time $t'_1$.

As noted above, the signal 210 at the terminal E will have a rising edge at the time $t'_1$, and due to the connection of the flip-flop 62 to the terminal RS, this signal will have a falling edge at the time $t_4$. Similarly, a pulse on the terminal E will reoccur between the times $t'_{1x}$ and the times $t_{4x}$.

The signal 210 is provided as one input to the AND gate 63 along with the signal 200 at the terminal B. Because of this configuration, the AND gate 63 can now directly respond to the second pulse of the sensor signal 200 produced at the terminal AS which commences at the time $t_2$. In essence, the circuit 60 has formed a first pulse reject circuit wherein the first sensor pulse commencing at the time $t_1$ has been rejected by this circuit such that the circuit can respond to the second pulse commencing at the time $t_2$ to provide a synchronizing pulse 207 at the terminal F if the sensor element 20 produces such a pulse prior to the time that the sensor element 21 will subsequently produce a pulse at the terminal RS that results in resetting the flip-flop 62.

The function of the inverter stage 61 should now become clear since it is this element that results in setting the AND gate input at the terminal E such that upon the occurrence of a second pulse at the terminal B (terminal AS) the AND gate 63 will provide a responsive pulse 207 at the terminal F. In this manner, a cylinder identification synchronizing signal 207 is provided at the terminal F at the times $t_2$ indicating that the projection 14 is passing by the sensor elements 20 and 21 rather than the projection 17.

Of course the first pulse reject circuit 60 could have been designed in an alternative manner to produce a positive pulse output in response to the passage of the leading edge 19 by the sensor elements 20 and 21 without the interim production of an additional sensing signal by the sensing element 20. This direct corollary structure to that shown in FIG. 2 is also contemplated by the present invention. In either event, the end result is a cylinder identification signal at the terminal F which indicates which of the devices 14 or 17 has passed the sensor elements 20 and 21 to produce the sensor pulses at the terminals AS and RS.

With cylinder identification information, the cylinder select circuit 50 can now be initialized such that the control signals provided as part of the signal 203 at the terminal D can now be routed to the proper engine cylinders in their proper engine cycle positions, and this has been accomplished without the use of any sensor in addition to the sensor elements 20 and 21 which are already being utilized by the engine timing calculation/control circuit described in the Wrathall U.S. Pat. No. 4,231,332. It should be noted that both sensors in the Wrathall circuitry are utilized by the control circuit 40 since one of these sensors defines the latest times for dwell initiation while the other defines the latest times for spark occurrence, and during conditions of low engine speed, such as those which occur during engine start-up, dwell initiation and spark occurrence are implemented at these latest times, respectively.

From the above description of the operation of the first pulse reject circuit, it should be clear how the illustrated circuitry derives the initial synchronizing pulse 207 by determining if the first sensor element 20 provides more than one pulse prior to substantially no later than approximately the time $t_4$ at which the second sensor element 21 provides a pulse after the first sensor element 20 provides a first pulse (at times $t_1$). However, it should be noted that since spark induced sensor pulses are not blocked for the pulses provided by sensor element 21, processor 30 blocks such pulses coming from the sensor element 20, the flip-flop 62 can be reset by a spark induced pulse at times $t_3$ or $t_{3x}$. However, upon analysis this only means that the flip-flop 62 may be reset earlier than the times $t_4$. To safeguard the system in this mode of operation merely requires positioning the projections 15 and 16 close together so that the occurrence of the leading edge 22 is prior to any spark occurrence which may occur prior to the times $t_4$.

The operation of the cylinder select circuit 50 will now be described with respect to how it receives the signal 206 from the terminal F and provides for the proper effective routing of the control signals at the terminal D to the complimentary output terminals G and H, which provide control signals for cylinder apparatus.

It should be noted that for an ignition control system such as that shown in FIG. 1, the terminal G will be connected to an amplifying stage 70 which provides an output to one end of a primary ignition coil 71 having its other end connected to the terminal B+. A secondary winding 72 positioned adjacent to the primary winding 71 creates high voltage ignition sparks across air gaps 73 and 74 which correspond to the spark plug gaps in the first and third cylinders of a four cylinder engine. Similarly, the output terminal H of the system 10 shown in FIG. 1 is connected as an input to an amplifying stage 75 that has its output connected to one end of a primary coil winding 76 having its other end connected to B+. A corresponding secondary winding 77 supplies induced high voltage sparks across air gaps 78 and 79 corresponding to the spark plug gaps in the second and fourth cylinders of the engine.

It should be noted that the configuration described for the components 70–79 directly corresponds to the output configuration illustrated in U.S. Pat. No. 4,104,997 to Kenneth Padgitt which is assigned to the same assignee as the present invention. These engine control systems correspond to distributorless ignition systems in which a circuit corresponding to the cylinder select circuit 50 provides cylinder spark excitation signals to the engine cylinders by electronically selecting the pair of cylinders to be excited and then electronically routing the desired spark excitation signals thereto.

In the system 10 shown in FIG. 1, sparks will occur simultaneously across the air gaps 73 and 74, but one of the first and third cylinders will be in its proper compression cycle for instituting spark ignition combustion whereas the other cylinder will be in its exhaust cycle wherein the creation of spark during this cycle has no appreciable effect. A similar analysis applies to the engine cylinders corresponding to the air gaps 78 and 79. Of course, if individual sparks are to be applied to each cylinder without generating a simultaneous redundant spark in a cylinder in an opposite engine cycle position, this can readily be accomplished by minor modifications to the illustrated circuitry such as rotating the rotary member 11 twice for each engine crankshaft revolution and switching between complimentary pairs of outputs G and H and additional terminals G' and H' coupled to additional coil assemblies each being coupled to one of the engine cylinder spark plugs.

Figure 4:
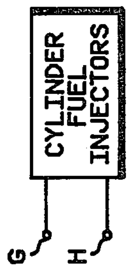
FIG. 4 is a partial schematic diagram illustrating an alternate configuration for the utilization of output signals provided by the control system illustrated in FIG. 1.

It should also be noted that the present invention contemplates utilizing a fuel injection calculation circuit as the circuit 40 and having the cylinder select apparatus 50 route fuel injection control signals through it to the actuator coil of fuel injection apparatus associated with each of the engine cylinders. FIG. 4 illustrates such a fuel injection system in general form.

The control signals forming signal 203 at the terminal D are coupled via a direct connection to the clock terminal of an alternately stepping flip-flop circuit 51 and the signal 203 is also coupled through an inverter stage 52 as an input to an AND gate 53. The AND gate 53 provides an output signal 211 at a terminal N which is directly connected as an input to each of a pair of AND gates 54 and 55. The AND gate 54 receives a non-inverting output signal 212 of the flip-flop 51 provided at a terminal K as an additional input, and the AND gate 55 receives an inverted output signal 213 of the flip-flop 51 provided at a terminal L as an additional input. The AND gate 54 provides as its output the signal 204 at the terminal G and the AND gate 55 provides as its output the signal 205 at the terminal H. The terminal L is directly connected to a data terminal of the flip-flop 51 which has a reset terminal connected to a terminal J which is connected as an input to the set terminal of a flip-flop 56 which receives a reset input by a direct connection to the POR terminal and provides an output signal 214 at a terminal M that is connected as an input to the AND gate 53.

The terminal F is directly connected as an input to the set terminal of a flip-flop 57 that provides a signal 215 as its output which is connected to a terminal I that supplies an input to an AND gate 58 whose output is directly connected to the terminal J at which a signal 216 is provided. The AND gate 58 receives an additional input by virtue of a direct connection to the terminal D. The terminal J is also connected as an input to a delay circuit 59 which has its output connected directly to a first reset terminal ($R_1$) of the flip-flop 57 which has a second reset terminal ($R_2$) directly connected to the POR terminal. The operation of the components 51 through 59 of the cylinder select circuit 50 will now be described in detail with respect to the signal waveforms illustrated in FIG. 3.

As noted above, the signal 206 at the terminal F comprises a synchronizing cylinder identification pulse 207 which indicates which of the devices 14 or 17 has just passed the sensor elements 20 and 21. By noting this, the cylinder select circuit 50 will then provide for routing the control signals produced at the terminal D to the appropriate engine cylinders. The cylinder select circuit 50 includes inhibiting means which prevents any routing of any control signals to the engine cylinders until an initial cylinder identification pulse 207 has been provided at the terminal F. In addition, for the ignition system shown in FIG. 1, the cylinder select circuit 50 is provided with apparatus to insure that cylinder selection is not implemented during the time that the control circuit 40 determines that dwell excitation should be applied to an engine cylinder. In other words, the signals comprising signal 203 at the control terminal D are not to be coupled to any of the primary excitation coils 71 or 76 until an appropriate time after the creation of the initial cylinder identification signal pulse 207 at the terminal F and this will be accompolished by effective delay circuitry in the select circuit 50.

The signal 206 at the terminal F is illustrated in FIG. 2 as comprising a short duration pulse 207 commencing at the time $t_2$ in response to the passage of the leading edge 22 by the sensor element 20. The rising pulse transition at the time $t_2$ of the signal 206 will result in setting the flip-flop 57 and thereby providing a latched signal, signal 215, at the terminal I corresponding to the waveform shown in FIG. 3. This latched signal 215 will continue until an output from the AND gate 58 is produced by the occurrence of a rising transition at the control terminal D which in general will occur at the time $t_3$ as illustrated in FIG. 3. The result of this is the production of a rising transition at the terminal J at the time $t_3$ wherein this rising transition is coupled to a first reset terminal of the flip-flop 57 through a delay circuit 59 that provides a small finite fixed time duration delay. The end result of this is the production of the resultant signal 216 at the terminal J which has a duration equal to the time delay provided by the circuit 59 and wherein the signal 216 is produced in response to the cylinder identification pulse 207 produced at the time $t_2$ at the terminal F but is now shifted in time occurrence until the time $t_3$.

Since the terminal J is directly connected to the reset terminal of the flip-flop 51, this insures initialization of the flip-flop 51 at the first time of calculated spark occurrence ($t_3$) following the production of an initial cylinder identification pulse 207 at the time $t_2$. This therefore results in initializing the sequencing to be accomplished by the flip-flop circuit 51. Since the clock terminal of the flip-flop 51 is directly connected to the terminal D, and since the inverting output signal 213 of the flip-flop 51 provided at the terminal L is coupled back to the data terminal of the flip-flop 51, this configuration results in having the flip-flop 51 provide for complimentary output signals 212 and 213 at the terminals K and L wherein these signals are switched at every $t_3$ or $t_{3x}$ occurrence that occurs subsequent to the occurrence of a delayed cylinder identification pulse 207 at the terminal J occurring at the time $t_3$. In other words, the output signals 212 and 213 at the terminals K and L, once a cylinder identification pulse at $t_2$ has been provided at the terminal F and a spark ignition occurrence signal transition at $t_3$ has been provided at the terminal D, represent complimentary signals corresponding to known half-cycle revolutions of the rotary body 11 such that by utilizing this information it can be determined whether the control signals produced at the terminal D are intended for the first and third cylinder pairs or the second and fourth cylinder pairs.

The operation of the flip-flop 51 can also be viewed as having the flip-flop 51 periodically reset at $t_3$ in response to each delayed cylinder identification pulse 207 produced at the terminal J and having this reset state switched at every spark ignition occurrence $t_{3x}$ that occurs between the periodic resetting. In any event, the waveforms for the signals 212 and 213 at the terminals K and L are as shown in FIG. 3 wherein prior to the first time $t_3$, the states of the signals at the terminals K and L are indeterminate wherein this does not matter due to the operation of the components 52–56 as will now be described since these components prevent providing any output excitation signals from being created at the terminals G or H until after the creation of the cylinder identification pulse 207 at time $t_2$ at terminal F and also after the creation of the effectively delayed cylinder identification pulse at the terminal J at time $t_3$.

The flip-flop 56 receives the signal 216 at the terminal J which corresponds to a delayed cylinder identification pulse. Until this pulse is received at the set terminal of the flip-flop 56, the output signal 214 at the terminal M will remain low such that the AND gate 53 will be unable to provide a high logic state signal at the terminal N which would result in allowing the AND gates 54 and 55 to create high logic signals at the terminals G and H. The end result is that until the flip-flop 56 is set by the occurrence of a delayed cylinder identification pulse at the terminal J, the AND gates 54 and 55 will not pass any signals through them and the signals at the terminals G and H will remain in a low state. Thus, clearly the elements 52 through 56 comprise an inhibit means which prevents the utilization of the control signals at the terminal D until the occurrence of a cylinder identification pulse.

Once a delayed cylinder identification pulse has occurred at the terminal J, then the flip-flop 56 will remain set and a high logic signal 214 will be latched and provided at the terminal M thus enabling the AND gate 53 to selectively pass the control signals at the terminal D through to the terminal N. Of course, due to the existence of the inverter 52, the signals at the terminal N will correspond to the inverted control signals provided at the terminal D which occur after the occurrence of the delayed cylinder identification pulse at the terminal J. This is illustrated by the waveforms in FIG. 3 for signal 211.

By analyzing the waveforms of the signals 212, 213 and 211 produced at the terminals K, L and N, it becomes clear that the signals 212 and 213 at the terminals K and and L result in the alternate providing of the pulses of the signal 211 at the terminal N to the output terminals G and H. This results in the alternate energization of the primary coil windings 71 and 76 such that for each engine crankshaft revolution resulting in a complete revolution of the rotary member 11, one of the first and third and one of the second and fourth engine cylinders which is in its proper compression cycle will receive appropriate dwell initiation and spark timing occurrence control signals, while in the next subsequent engine crankshaft revolution, the others of the engine cylinders which are now in their compression cycle will receive dwell initiation and spark timing occurrence signals at the proper times.

The above described circuitry illustrates how the engine control system 10 shown in FIGS. 1 and 2 provides a distributorless ignition system for a four cylinder engine through the utilization of the first pulse reject circuit 60 that provides cylinder identification pulses 207 which distinguish between the rotating devices 14 and 17 on the rotary member 11.

Figure 5:
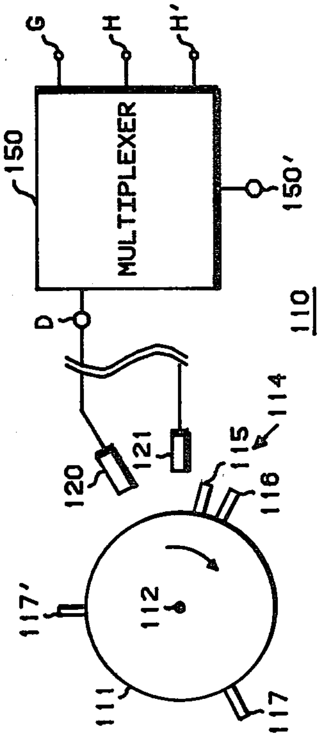
FIG. 5 is a partial schematic diagram illustrating how the control system illustrated in FIG. 1 can be expanded from a four-cylinder system to a six-cylinder system.

FIG. 5 illustrates an alternate embodiment for a similar control system 110 for a six-cylinder engine. In FIG. 5, only the configuration for a corresponding rotary body member 111 and sensor elements 120 and 121 is illustrated, as well as a corresponding cylinder select circuit 150. Essentially, modifying the system 10 to accomodate six engine cylinders instead of four is readily accomplished by providing three equally space devices 114, 117 and 117' which are affixed to the rotary member 111 wherein the devices 117 and 117' comprise a single outward radial extension of the member 111 whereas the synchronizing device 114 comprises separate individual extensions 116 and 115. Sensor elements 120 and 121 are provided in the six-cylinder system and directly correspond to the positioning of the elements 20 and 21 in the control system 10.

It should be apparent that for the system 110 again a first pulse reject circuit will be utilized to determine if the sensor element 120 provides more than one pulse prior to the sensor element 121 providing a pulse. If this occurs, this will indicate the passage of the device 114 by the sensor elements and thereby allow the proper routing of engine control signals at the terminal D to the appropriate cylinders in their various engine cycle states.

The appropriate routing for the system 110 is illustrated as being accomplished by a multiplexer circuit 150 wherein this circuit receives its initializing information from a terminal 150' that is responsive to a cylinder identification pulse, and the sequential stepping of the control signals at the terminal D to various pairs of engine cylinders is accomplished in accordance with the transitions of the control signals at the terminal D in much the same manner that the system 10 illustrated in FIGS. 1 and 2 accomplished its sequential stepping. The embodiment in FIG. 5 is merely being illustrated to point out that the concept of the present invention can readily be expanded to accomodate any number of cylinders while still retaining the basic underlying principles as stated in the attached claims.

While I have shown and described specific embodiments of this invention, further modifications and improvements will occur to those skilled in the art. All such modifications which retain the basic underlying principles disclosed and claimed herein are within the scope of this invention.

I claim:

1. An engine control system adaptable for controlling engine functions for a three or more cylinder engine, comprising the combination of:

a rotary member synchronously rotated by an engine crankshaft, said rotary member having at least first and second devices fixed thereto and spaced apart by a first fixed angle of rotation of said rotary member;

first and second stationary sensor means positioned adjacent to said rotary member, each of said sensor means detecting the passage of each of said first and second devices and producing pulses in response thereto, said first and second sensor means positioned apart by a second fixed angle of rotation of said rotary member; and control circuit means for receiving said sensor pulses produced by said first and second sensor means and providing in response thereto control signals for controlling engine functions as a function of at least one of the rotational position of the rotary member and engine crankshaft speed, the improvement comprising an engine cylinder identification means for identifying when a predetermined rotational position of said rotary member occurs, said cylinder identification means characterized by, said first device comprising a plurality of at least two adjacent individual devices spaced apart by a fixed angle of rotation less than said second angle of rotation, passage of each of said individual devices by either of said sensor means providing a corresponding sensor pulse, said second fixed angle of rotation being less than said first fixed angle of rotation, and first pulse reject circuit means for receiving pulses corresponding to said sensor pulses and for providing an initial cylinder identification pulse in response to determining if said first sensor means provides more than one pulse in response to the passage of one of said first and second devices prior to a time no later than approximately the time at which said second sensor means subsequently provides a pulse in response to the passage of said one of said first and second devices after said first sensor means provides a first pulse, whereby said cylinder identification means can readily distinguish between the passage of said first and second devices by the first and second sensor means and thereby correctly identify the precise rotational position of said rotary member and engine crankshaft.

2. An engine control system according to claim 1 which includes inhibit means for inhibiting the utilization of said control signals to control said engine functions until at least the occurrence of said initial cylinder identification pulse.

3. An engine control system according to claim 1 which includes cylinder sequencing means for receiving said sensor pulses and said initial cylinder identification pulse and in response thereto providing said engine control signals to engine cylinder apparatus, associated with each of the engine cylinders, in a predetermined desired sequence.

4. An engine control system according to claim 2 which includes cylinder sequencing means for receiving said sensor pulses and said initial cylinder identification pulse and in response thereto providing said engine control signals to engine cylinder apparatus, associated with each of the engine cylinders, in a predetermined desired sequence.

5. An engine control system according to claim 1 wherein said first pulse reject means provides said initial cylinder identification pulse in response to said first sensor means providing more than one pulse prior to a time no later than approximately said time at which said second sensor means provides a pulse after said first sensor means provides said first pulse.

6. An engine control system according to any of claims 1, 2, 3, 4 or 5 which includes fuel injection means coupled to said control means for receiving said control signals and providing fuel injection to engine cylinders in response thereto.

7. An engine control system according to any of claim 1, 2, 3, 4 or 5 which includes cylinder ignition means coupled to said control means for receiving said control signals and providing sequential dwell excitation and ignition sparks for the engine cylinders in response thereto.

8. An engine control system according to claim 7 wherein said cylinder ignition means comprises distributorless ignition apparatus for providing cylinder spark excitation by electronically selecting the cylinder to be excited and electronically routing spark excitation signals thereto.

9. An engine control system according to claim 7 wherein said time no more than approximately the time at which said second sensor means subsequently provides a pulse substantially corresponds to the time occurrence of a spark ignition signal provided by said control circuit means.

10. An engine control system according to claim 7 wherein said first pulse reject circuit means comprises a flip-flop circuit means for receiving input pulses related to said first and second sensor pulses and for providing an output to an AND gate means which receives at least one signal related to at least one of said sensor pulses as an additional input and provides said initial cylinder identification pulse as an output.

11. An engine control system according to claim 7 which includes effective delay means for receiving said cylinder identification pulse as an input and for providing a corresponding delayed output pulse, said delayed pulse being utilized by circuit means to prevent cylinder selection during the time that said control circuit means determines that dwell excitation should be applied to an engine cylinder.

12. An engine control system according to claim 7 wherein said first fixed angle of rotation by which said first and second projections are spaced apart corresponds to substantially 180 degrees of rotation of said rotary body and wherein said control circuitry means provides control signals for controlling the dwell and spark timing for four engine cylinders.

13. An engine control system according to claim 7 wherein said first and second devices fixed to said rotary member comprise projections extending from said rotary member and wherein said individual devices of said first device comprise at least two individual projections extending from said rotary member.

14. An engine control system according to claim 7 wherein said first and second sensor means are positioned at fixed angular positions of rotation of said rotary body corresponding to the latest times of dwell initiation and spark timing occurrence, respectively, for the engine cylinders.

15. An engine control system according to claim 7 which includes gate means coupled to said first sensor for blocking pulses of said first sensor during spark ignition, whereby false cylinder identification caused by spark ignition induced sensor pulses is prevented.

* * * * *